(12) United States Patent
Chen et al.

(10) Patent No.: US 11,991,860 B2
(45) Date of Patent: May 21, 2024

(54) FLUID COOLING DEVICE

(71) Applicant: Auras Technology Co., Ltd., New Taipei (TW)

(72) Inventors: Chien-Yu Chen, New Taipei (TW); Wei-Hao Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 281 days.

(21) Appl. No.: 17/513,297

(22) Filed: Oct. 28, 2021

(65) Prior Publication Data

US 2022/0142002 A1 May 5, 2022

Related U.S. Application Data

(60) Provisional application No. 63/107,075, filed on Oct. 29, 2020.

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ..... *H05K 7/20345* (2013.01); *H05K 7/20327* (2013.01)

(58) Field of Classification Search
CPC .......... H05K 7/20345; H05K 7/20327; H05K 7/2029
See application file for complete search history.

(56) References Cited

U.S. PATENT DOCUMENTS

| 2005/0185378 A1* | 8/2005 | Tilton | H05K 7/20345 361/699 |
| 2009/0314467 A1* | 12/2009 | Campbell | H01L 23/4735 165/80.4 |
| 2014/0204538 A1* | 7/2014 | Choi | G06F 1/1626 361/729 |
| 2020/0359528 A1* | 11/2020 | Tsai | H01L 23/473 |
| 2021/0348624 A1* | 11/2021 | Diglio | F04D 29/588 |
| 2023/0010253 A1* | 1/2023 | Balachandar | B05B 1/02 |

* cited by examiner

*Primary Examiner* — Anthony M Haughton
(74) *Attorney, Agent, or Firm* — MUNCY, GEISSLER, OLDS & LOWE, P.C.

(57) ABSTRACT

A fluid cooling device includes a bottom plate, an adhesive layer and a spray cooling cover. The bottom plate includes a substrate and a chip, and the spray cooling cover is fixed on the bottom plate by an adhesive layer. In addition, the spray cooling cover includes a fluid inlet and a plurality of fluid outlets to utilize a working fluid to cool the chip directly.

7 Claims, 5 Drawing Sheets

FLUID COOLING DEVICE

RELATED APPLICATIONS

This application claims priority to U.S. Provisional Application Ser. No. 63/107,075, filed Oct. 29, 2020, the disclosures of which are incorporated herein by reference in their entireties.

TECHNICAL FIELD

The present disclosure generally relates to a fluid cooling device. More particularly, the present disclosure relates to a fluid cooling device for cooling a chip.

BACKGROUND

With the advancement of technology, electronic products have become more popular, and gradually changed the life or work of many people. As the calculating power of the computers increases, the temperature control of the electronic components such as the central processing units is more important.

Electronic components such as the central processing units generate heat during operation and require proper cooling to achieve the best performance. In order to keep the electronic components such as the central processing unit operating at a proper temperature, fluid cooling devices or air cooling devices are usually used.

In a current water-cooling heat dissipation process, a working fluid flows into the cold plate through the pipeline, and the cold plate contacts the surface of the metal cover of the electronic component such as the central processing unit to take away the heat generated by the operating electronic component, thereby reducing the operating temperature of the electronic component, and improving the operation efficient of the electronic component.

However, because the central processing unit and the working fluid are separated by a metal cover, also referred to as an integrated heat spreader (IHS), for protecting the central processing unit and a cold plate, the cooling efficiency is therefore reduced. Therefore, there is a need to effectively improve the cooling efficiency of the cooling device to further improve the performance and efficiency of the electronic components.

SUMMARY

One objective of the embodiments of the present invention is to provide a fluid cooling device to effectively improve the heat dissipation efficiency of the cooling device and reduce the working temperature of the electronic component.

To achieve these and other advantages and in accordance with the objective of the embodiments of the present invention, as the embodiment broadly describes herein, the embodiments of the present invention provides a fluid cooling device including a bottom plate, an adhesive layer and a spray cooling cover. The bottom plate includes a substrate and a chip, and the adhesive layer fixes the spray cooling cover on the bottom plate. The spray cooling cover includes a fluid inlet and a plurality of fluid outlets to utilize a working fluid to directly cool the chip.

In one or more embodiments, the spray cooling cover includes a cooling cavity and a fluid jet array. The chip is located in the cooling cavity and the fluid jet array is disposed above the cooling cavity to spray the working fluid to a surface of the chip.

In one or more embodiments, the spray cooling cover further includes a plurality of buffer cavities respectively located beside the cooling cavity.

In one or more embodiments, the heights of the buffer cavities are higher than a height of the cooling cavity.

In one or more embodiments, the spray cooling cover further includes a plurality of discharge channels to respectively connect to the buffer cavities and corresponding fluid outlets.

In one or more embodiments, each buffer cavity further includes a buffer cavity outlet to connect to a corresponding discharge channel.

In one or more embodiments, the buffer cavity outlet is a rectangular opening.

In one or more embodiments, the fluid jet array includes a plurality of nozzles arranged in one row above the chip.

In one or more embodiments, each nozzle includes a jet hole and a flared opening.

In one or more embodiments, the working fluid directly contacts a surface of the chip, and the working fluid is a two-phase working fluid.

Hence, the fluid cooling device of the present invention can directly spray the working fluid on the surface of the heat source, for example, a surface of a chip such as a central processing unit, for cooling the heat source, so as to effectively control the working temperature of the chip and improves the working efficiency of the chip and the electronic device with the same.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
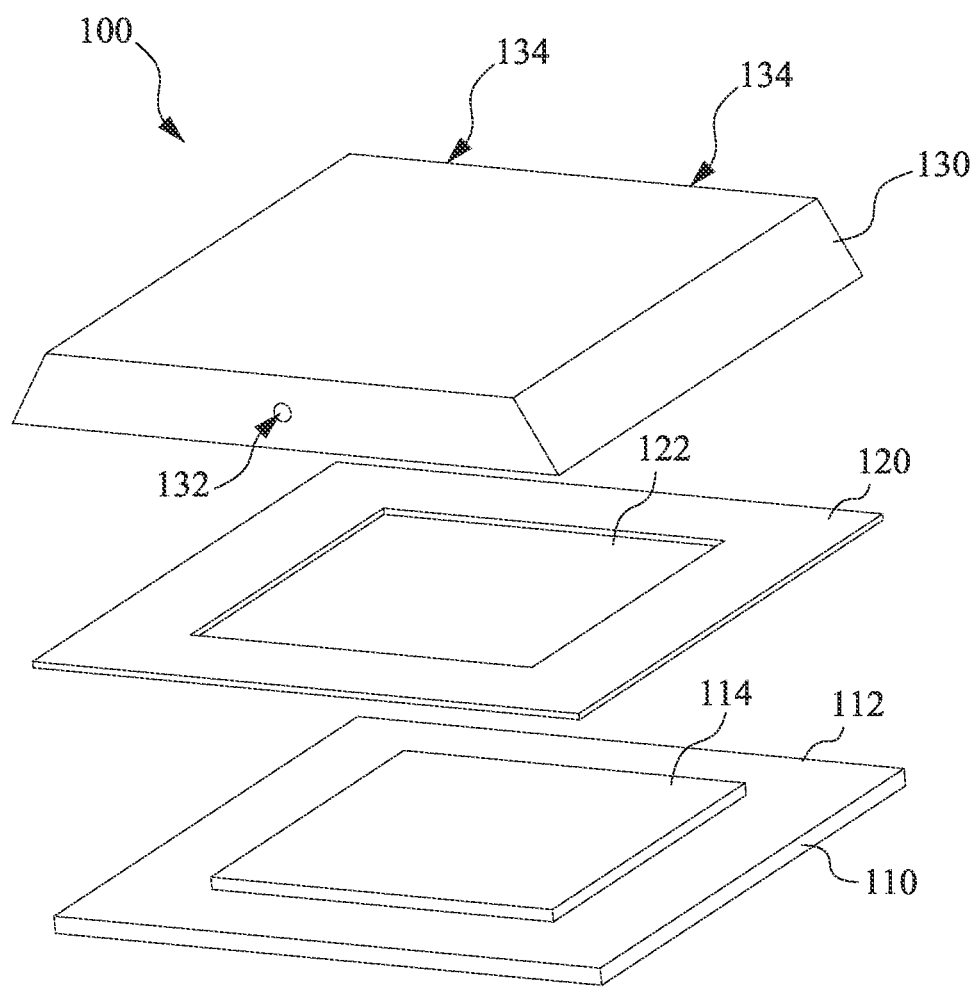
FIG. 1 illustrates a schematic exploded view showing a fluid cooling device according to one embodiment of the present invention.
Figure 2:
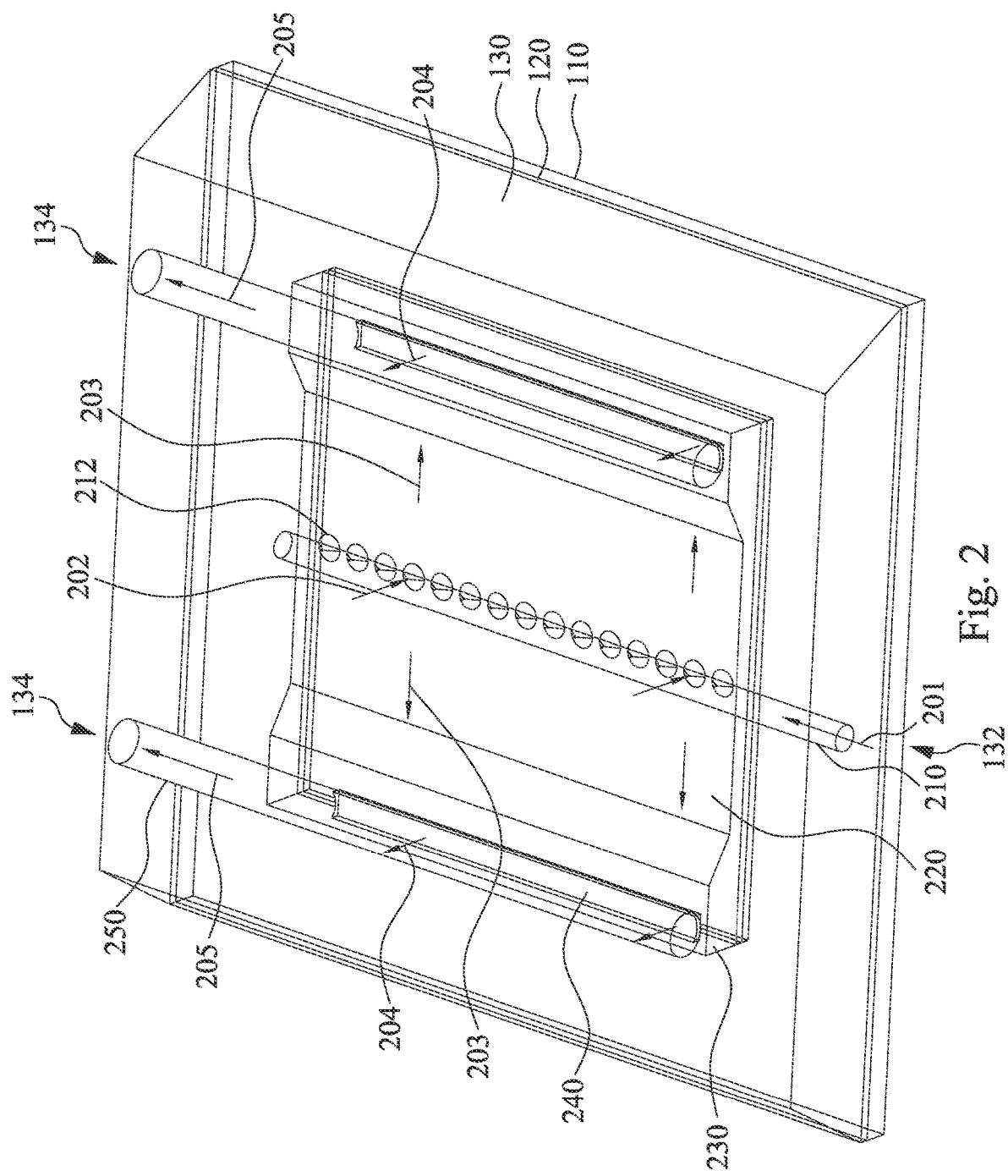
FIG. 2 illustrates a schematic perspective view showing the fluid cooling device of FIG. 1.
Figure 3:
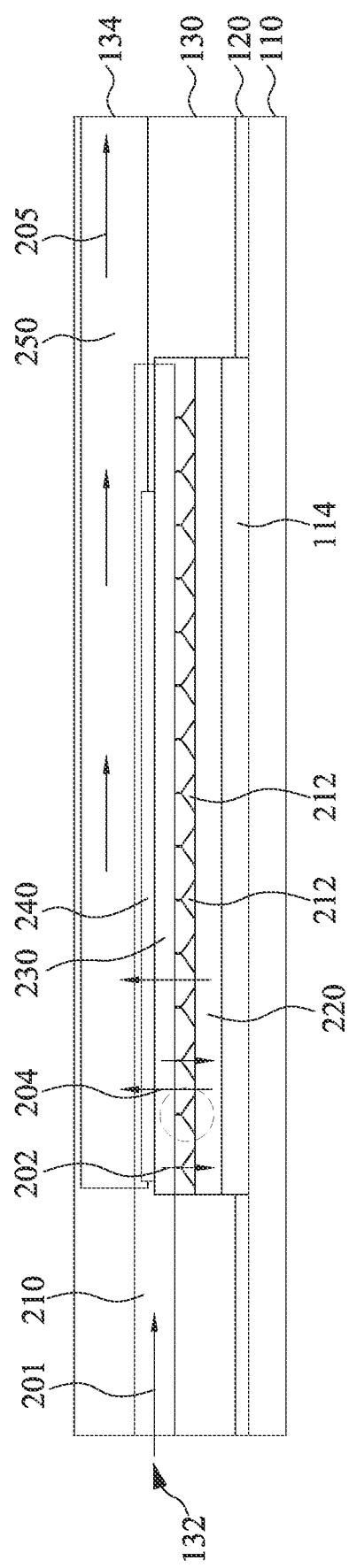
FIG. 3 illustrates a schematic right side view showing the fluid cooling device of FIG. 1.
Figure 4:
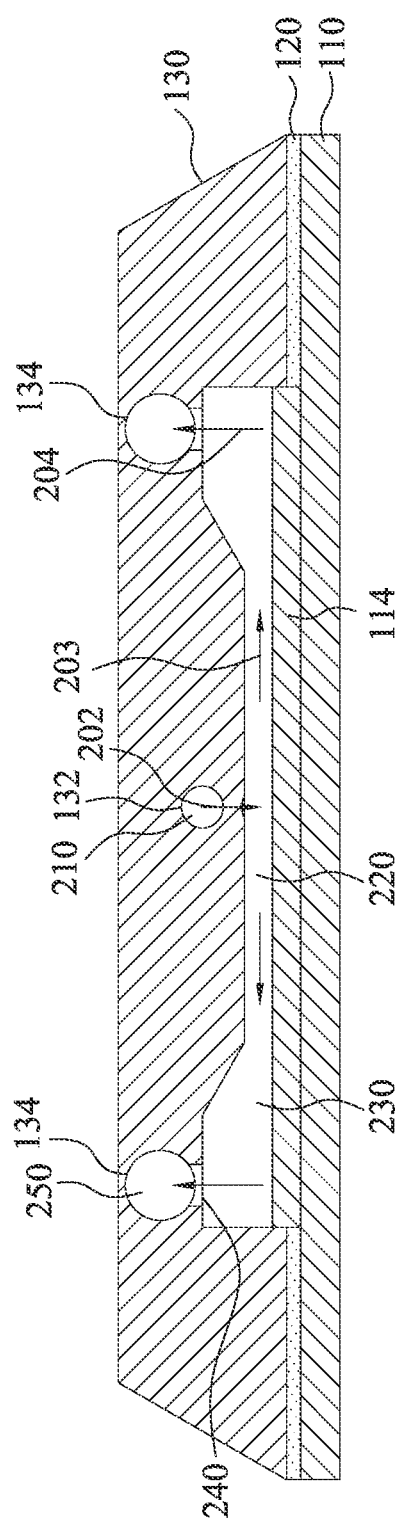
FIG. 4 illustrates a schematic cross sectional front view showing the fluid cooling device of FIG. 1.
Figure 5:
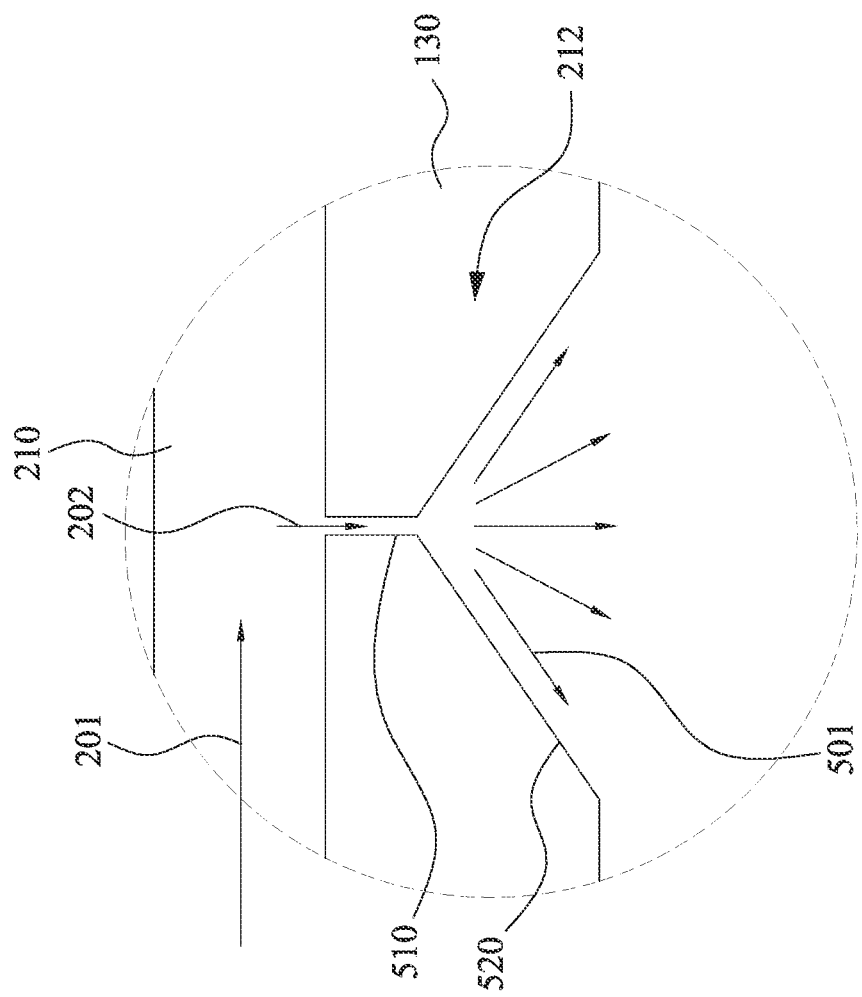
FIG. 5 illustrates a schematic view showing a nozzle of the fluid cooling device.

FIG. 1 is a schematic exploded view showing a fluid cooling device according to one embodiment of the present invention, FIG. 2 is a schematic perspective view to see the internal structure of the fluid cooling device, FIG. 3 is a schematic right side view, FIG. 4 is a schematic cross sectional front view and FIG. 5 is a schematic view of a nozzle of the fluid cooling device.

Referring to FIG. 1, the fluid cooling device 100 includes a bottom plate 110, an adhesive layer 120 and a spray cooling cover 130. The bottom plate 110 includes a substrate 112 and a chip 114, and the spray cooling cover 130 is fixed on the bottom plate 110 by the adhesive layer 120. In addition, the spray cooling cover 130 includes a fluid inlet 132 and a plurality of fluid outlets 134 to cool the chip 114 by a working fluid.

In one or more embodiments, the chip 114 is, for example, a central processing unit (CPU) or any other electronic components that need heat dissipation.

Further referring FIG. 2 to FIG. 4, the spray cooling cover 130 includes a cooling cavity 220, a fluid jet array 210, a plurality of buffer cavities 230 and a plurality of discharge channels 250. The chip 114 is disposed in the cooling cavity 220, and the fluid jet array 210 is disposed above the cooling cavity 220 to spray the working fluid on the surface of the chip 114 so as to directly cool the chip 114.

In one or more embodiments, the adhesive layer 120 includes an opening 122 to accommodate the chip 114 in the cooling cavity 220. The adhesive layer 120 is, for example, a packaging material such as epoxy resin to fix and seal the bottom plate 110 and the spray cooling cover 130, and the adhesive layer 120 is preferably formed on four side surfaces of the chip 114. In one or more embodiments, the surface of the adhesive layer 120 is coplanar with the upper surface of the chip 114 to allow the working fluid flowing through the upper surface of the chip 114 and effectively prevent the working fluid from contacting electrical circuits on the substrate 112 and causing a short circuit problem.

The fluid jet array 210 includes a plurality of nozzles 212 located above the chip 114. The fluid jet array 210 can be a one-dimensional nozzle array, for example, a row of nozzles 212. In addition, the fluid jet array 210 can be a two-dimensional nozzle array, for example, two rows of nozzles 212, without departing from the spirit and scope of the present invention.

In one or more embodiments, further referring to FIG. 5, each of the nozzles 212 includes a jet hole 510 and a flared opening 520 to enable the working fluid to expand in volume after passing through the nozzles 212 so as to reduce the temperature of the working fluid while entering into the cooling cavity 220.

The working fluid is pressured in the jet hole 510 and injected into the cooling cavity 220, the working fluid is instantaneously expanded due to the flared opening 520 and the pressure of the cooling cavity 220 lower than the pressure of the jet hole 510, and the working fluid flows from the fluid inlet 132 to the fluid jet array 210 of a high pressure area and then enters into the cooling cavity 220 of a low pressure area, so that the internal energy of the working fluid and the temperature of the working fluid are dropped. The working fluid is sprayed to the surface of the chip 114 in a horn shape along the fluid jetting direction 501 so that the working fluid directly contacts the surface of the chip 114, thereby achieving a better cooling effect.

In one or more embodiments, the working fluid is a single-phase cooling fluid, i.e. water or oil. In one or more embodiments, the working fluid is a two-phase cooling fluid, i.e. refrigerant, to absorb the heat generated by the chip 114 with the phase change to further improve the cooling efficiency of the fluid cooling device 100.

The buffer cavities 230 are located beside the cooling cavity 220, for example, on both sides of the cooling cavity 220. In addition, the heights of the buffer cavities 230 are higher than the height of the cooling cavity 220 that is conducive to the working fluid flowing from the high pressure area to the low pressure area, so that the working fluid is discharged from the two discharge channels 250 and further discharged from the spray cooling cover 130 through the fluid outlets 134.

In addition, the discharge channels 250 are utilized to respectively connect to the buffer cavities 230 and corresponding fluid outlets 134, and located above the buffer cavities 230. In one or more embodiments, each buffer cavity 230 further includes a buffer cavity outlet 240 in fluid communication with the discharge channel 250, and the buffer cavity outlet 240 facilitates the flowing flow of the working fluid to discharge from fluid cooling device 100. In one or more embodiments, the buffer cavity outlet 240 is a rectangular opening, but not limited to this.

The fluid jet array 210 is in fluid communication with the fluid inlet 132 so that the working fluid enters into the fluid inlet 132 along the fluid flowing direction 201 and subsequently passes through the fluid jet array 210. The working fluid is sprayed downward through the nozzles 212 of the fluid jet array 210 along the fluid flowing direction 202 to directly contact with the chip 114. In addition, the working fluid further flows to the two sides of the cooling cavity 220 along the fluid flowing direction 203 to enter into the buffer cavities 230. The working fluid further flows upwardly along the fluid flowing direction 204 to pass through the buffer cavity outlet 240 to enter into the discharge channel 250, and discharges from the fluid outlet 134 along the fluid flowing direction 205.

Accordingly, the fluid cooling device of the present invention can directly spray the working fluid on the surface of the heat source, for example, a surface of a chip such as a central processing unit, for cooling the heat source, so as to effectively control the working temperature of the chip and improves the working efficiency of the chip and the electronic device with the same.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:
1. A fluid cooling device, comprising:
a bottom plate, wherein the bottom plate comprises a substrate and a chip;
an adhesive layer; and
a spray cooling cover, wherein the adhesive layer fixes the spray cooling cover on the bottom plate, wherein the spray cooling cover comprises a fluid inlet and a plurality of fluid outlets to utilize a working fluid to directly cool the chip, wherein the spray cooling cover further comprises:
a cooling cavity, wherein the chip is located in the cooling cavity;
a fluid jet array disposed above the cooling cavity to spray the working fluid to a surface of the chip;
a plurality of buffer cavities respectively located beside the cooling cavity; and
a plurality of discharge channels to respectively connect to the buffer cavities and corresponding fluid outlets, wherein the fluid outlets are arranged opposite the fluid inlet, and the buffer cavities and the discharge channels are respectively parallel to the fluid jet array.

2. The fluid cooling device of claim 1, wherein heights of the buffer cavities are higher than a height of the cooling cavity.

3. The fluid cooling device of claim 2, wherein each of the buffer cavities further comprises a buffer cavity outlet to connect to a corresponding discharge channel.

4. The fluid cooling device of claim 3, wherein the buffer cavity outlet is a rectangular opening.

5. The fluid cooling device of claim 1, wherein the fluid jet array comprises a plurality of nozzles arranged in one row above the chip.

6. The fluid cooling device of claim 5, wherein each of the nozzles comprises a jet hole and a flared opening.

7. The fluid cooling device of claim 1, wherein the working fluid directly contacts a surface of the chip, and the working fluid is a two-phase working fluid.

* * * * *